United States Patent
Ehmke et al.

(10) Patent No.: US 9,890,036 B2
(45) Date of Patent: Feb. 13, 2018

(54) HERMETICALLY SEALED MEMS DEVICE AND ITS FABRICATION

(71) Applicant: TEXAS INSTRUMENTS INCORPORATED, Dallas, TX (US)

(72) Inventors: John Charles Ehmke, Garland, TX (US); Virgil Cotoco Ararao, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/429,636

(22) Filed: Feb. 10, 2017

(65) Prior Publication Data
US 2017/0152136 A1    Jun. 1, 2017

Related U.S. Application Data

(62) Division of application No. 14/827,683, filed on Aug. 17, 2015, now Pat. No. 9,567,213.

(51) Int. Cl.
*H01L 21/00* (2006.01)
*H01L 21/31* (2006.01)
(Continued)

(52) U.S. Cl.
CPC ........ *B81B 7/0038* (2013.01); *B81C 1/00285* (2013.01); *B81B 2203/0315* (2013.01);
(Continued)

(58) Field of Classification Search
CPC .......... B81B 2203/0315; B81B 7/0038; B81C 1/00285; B81C 1/00269; B81C 2201/0108; B81C 2201/013; B81C 2201/0188; B81C 2201/0198; B81C 2201/053; B81C 2203/0109; B81C 2203/035; B81C 2203/019; G02B 26/001; G02B 26/0833; G02B 6/4204; G02B 6/4208; G02B 6/4248; H01L 2924/0002; H01L 2924/00; H01L 2924/01006; H01L 2924/01013; H01L 2924/0102; H01L 2924/01024; H01L 2924/01074; H01L 2924/1461; B82Y 30/00

USPC .... 257/E21.502, E21.503, E21.17, E21.007, 257/E21.058, E21.231, E21.278, E21.329, 257/E21.509, E21.511, E23.128, 678,
(Continued)

(56) References Cited

U.S. PATENT DOCUMENTS

6,248,668 B1    6/2001    Beebe et al.
2005/0157376 A1    7/2005    Huibers et al.
(Continued)

*Primary Examiner* — Teresa M Arroyo
(74) *Attorney, Agent, or Firm* — Michael A. Davis, Jr.; Charles A. Brill; Frank D. Cimino (57) ABSTRACT

In described examples, a hermetic package of a microelectromechanical system (MEMS) structure includes a substrate having a surface with a MEMS structure of a first height. The substrate is hermetically sealed to a cap forming a cavity over the MEMS structure. The cap is attached to the substrate surface by a vertical stack of metal layers adhering to the substrate surface and to the cap. The stack has a continuous outline surrounding the MEMS structure while spaced from the MEMS structure by a distance. The stack has: a first bottom metal seed film adhering to the substrate and a second bottom metal seed film adhering to the first bottom metal seed film; and a first top metal seed film adhering to the cap and a second top metal seed film adhering to the first top metal seed film.

9 Claims, 8 Drawing Sheets

(51) Int. Cl.
*H01L 21/469* (2006.01)
*B81B 7/00* (2006.01)
*B81C 1/00* (2006.01)
*G02B 26/08* (2006.01)
*G02B 6/42* (2006.01)
*G02B 26/00* (2006.01)
*B82Y 30/00* (2011.01)

(52) U.S. Cl.
CPC .... *B81C 1/00269* (2013.01); *B81C 2201/013* (2013.01); *B81C 2201/0108* (2013.01); *B81C 2201/0188* (2013.01); *B81C 2201/0198* (2013.01); *B81C 2201/053* (2013.01); *B81C 2203/0109* (2013.01); *B81C 2203/035* (2013.01); *B82Y 30/00* (2013.01); *G02B 6/4204* (2013.01); *G02B 6/4208* (2013.01); *G02B 6/4248* (2013.01); *G02B 26/001* (2013.01); *G02B 26/0833* (2013.01); *H01L 2924/0002* (2013.01); *H01L 2924/0102* (2013.01); *H01L 2924/01006* (2013.01); *H01L 2924/01013* (2013.01); *H01L 2924/01024* (2013.01); *H01L 2924/01074* (2013.01)

(58) Field of Classification Search
USPC .......... 257/780, E21.128, E21.229, E21.304, 257/E29.324; 438/106, 30, 50, 680, 780; 174/50.63; 345/108, 85; 359/224.1, 290, 359/291, 292, 295, 298, 514; 385/14
See application file for complete search history.

(56) References Cited

U.S. PATENT DOCUMENTS

| | | |
|---|---|---|
| 2006/0065436 A1 | 3/2006 | Gally et al. |
| 2007/0298238 A1 | 12/2007 | Witvrouw et al. |
| 2008/0121343 A1 | 5/2008 | Cohen et al. |
| 2012/0319303 A1 | 12/2012 | Foster et al. |
| 2014/0268295 A1 | 9/2014 | Ehmke et al. |
| 2015/0357375 A1 | 12/2015 | Tsai et al. |

HERMETICALLY SEALED MEMS DEVICE AND ITS FABRICATION

CROSS-REFERENCE TO RELATED APPLICATION

This application is a divisional of U.S. patent application Ser. No. 14/827,683 filed Aug. 17, 2015, the entirety of which is hereby incorporated herein by reference.

BACKGROUND

This relates to semiconductor devices and processes, and more particularly to a structure and fabrication of hermetically sealed microelectromechanical system (MEMS) devices.

A wide variety of products collectively called microelectromechanical system (MEMS) devices are small, low weight devices on the micrometer to millimeter scale, which may have mechanically moving parts and often movable electrical power supplies and controls, or they may have parts sensitive to thermal, acoustic, or optical energy. MEMS have been developed to sense mechanical, thermal, chemical, radiant, magnetic, and biological quantities and inputs, and produce signals as outputs. Because of the moving and sensitive parts, MEMS have a need for physical and atmospheric protection. Consequently, MEMS are placed on or in a substrate and have to be surrounded by a housing or package, which has to shield the MEMS against ambient and electrical disturbances, and against stress.

A typical MEMS device integrates mechanical elements, sensors, actuators, and electronics on a common substrate. The manufacturing approach of a MEMS aims at using batch fabrication techniques similar to those used for microelectronics devices. MEMS can thus benefit from mass production and minimized material consumption to lower the manufacturing cost, while simultaneously realizing the benefits well-controlled integrated circuit processing technology.

Example MEMS devices include devices without moving parts and devices with moving parts. Examples of MEMS devices without moving parts are ink jet print heads mechanical sensors, strain gauges, pressure sensors with microphone membranes, and inertial sensors such as accelerometers coupled with the integrated electronic circuit of the chip. Among the MEMS devices with moving parts but without rubbing or impacting surfaces, are gyros, comb devices, resonators and filters. In other classes, the moving parts may impact surfaces, such as in digital mirror devices (DMDs), relays, valves, and pumps; or the moving parts may impact and rub surfaces, such as in optical switches, shutters, scanners, locks, discriminators, and variable electrostatic actuators (VEAs). In MEMS devices with moving parts, the mechanically moving parts are fabricated together with the sensors and actuators in the process flow of the electronic integrated circuit (IC) on a semiconductor chip. The mechanically moving parts may be produced by an undercutting etch or removal of a sacrificial layer at some step during the IC fabrication. Examples of specific bulk micromachining processes employed in MEMS sensor production to create the movable elements and the cavities for their movements are anisotropic wet etching and deep reactive ion etching.

While the fabrication of these MEMS devices can benefit from wafer-level processes, their packages do not have to be fully hermetic, i.e. impermeable to water molecules. Consequently, they may use sealants made of polymeric compounds typically used in adhesive bonding. In contrast, DMDs require substantially fully hermetic packages, because they may include torsion hinges, cantilever hinges, and flexure hinges. Each movable mirror element of all three types of hinge DMD includes a relatively thick metal reflector supported in a normal, undeflected position by an integral, relatively thin metal hinge. In the normal position, the reflector is spaced from a substrate-supported, underlying control electrode, which may have a voltage selectively impressed thereon by an addressing circuit. A suitable voltage applied to the electrode can electrostatically attract the reflector to move or deflect it from its normal position toward the control electrode and the substrate. Such movement or deflection of the reflector causes deformation of its supporting hinge which stores potential energy that mechanically biases the reflector for movement back to its normal position when the attracting voltage is removed. The deformation of a cantilever hinge comprises bending about an axis normal to a hinge axis. The deformation of a torsion hinge comprises deformation by twisting about an axis parallel to the hinge axis. The deformation of a flexure hinge, which is a relatively long cantilever hinge connected to the reflector by a relatively short torsion hinge, comprises both types of deformation, permitting the reflector to move in piston-like fashion.

An example DMD (digital mirror device) MEMS is a spatial light modulator such as a DLP™ DMD device available from Texas Instruments Incorporated. A typical DMD includes an array of individually addressable light modulating pixel element micromirrors, the reflectors of each of which are selectively positioned to reflect or not to reflect light to a desired site. To avoid an accidental engagement of a reflector and its control electrode, a landing electrode may be added for each reflector. A risk exists that a deflected reflector may stick to or adhere to its associated landing electrode. Such stiction effect (static friction to be overcome for enabling relative movement) may be caused by intermolecular attraction between the reflector and the landing electrode or by high surface energy substances adsorbed on the surface of the landing electrode and/or on the portion of the reflector which contacts the landing electrode. Substances that may impart such high surface energy to the reflector-landing electrode interface include water vapor or other ambient gases (e.g., carbon monoxide, carbon dioxide, oxygen, nitrogen) and gases and organic components resulting from or left behind following production of the DMD.

The problem of stiction has been addressed by applying selected numbers, durations, shapes and magnitudes of voltage pulses to the control electrode, or by passivating or lubricating the portion of the landing electrode engaged by the deformed reflector, and/or the portion of the deformed reflector which engages the landing electrode. Passivation is effected by lowering the surface energy of the landing electrode and/or the reflector through chemically vapor-depositing on the engageable surfaces a monolayer of a long-chain aliphatic halogenated polar compound, such as perfluoroalkyl acid. An effective method of passivation is to enclose a source of passivation, such as a predetermined quantity to time-released passivant material, in a closed cavity with the micromirrors at time of device manufacture.

Conventional hermetic packaging of MEMS devices usually involves a packaging process that departs from the processes normally used for non-MEMS device packaging. MEMS hermetic packaging is expensive because the package often includes a ceramic material, or a metallic or glass lid, and also because the package must be configured to avoid contact with moving and other sensitive parts of the MEMS device and to further allow a controlled or reduced atmosphere inside the package. However, the high package cost is in conflict with market requirements for many applications of MEMS devices, which put a premium at low device cost and, therefore, low package cost.

Further, the conventional fabrication of hermetic MEMS packages also encounters many technical challenges, such as those caused by potentially high temperatures in connection with welding of a hermetic lid to the package base. For example, a proposed package with a sealing process using a glass core involves temperatures considerably above 450° C., typically between 525 and 625° C. dependent on the sealing glass selected. These temperature ranges are a risk for the reliability of silicon integrated circuits and for proper functioning of many MEMS device components, and inhibit passivation and lubrication methods. Similar and sometimes even higher temperatures are involved, when packages use techniques such as anodic bonding and glass frit bonding.

SUMMARY

In described examples, a hermetic package of a microelectromechanical system (MEMS) structure includes a substrate having a surface with a MEMS structure of a first height. The substrate is hermetically sealed to a cap forming a cavity over the MEMS structure. The cap is attached to the substrate surface by a vertical stack of metal layers adhering to the substrate surface and to the cap. The stack has a continuous outline surrounding the MEMS structure while spaced from the MEMS structure by a distance. The stack has: a first bottom metal seed film adhering to the substrate and a second bottom metal seed film adhering to the first bottom metal seed film; and a first top metal seed film adhering to the cap and a second top metal seed film adhering to the first top metal seed film.

DETAILED DESCRIPTION OF EXAMPLE EMBODIMENTS

Example embodiments include a hermetically sealed MEMS device with sidewall encapsulation of seed layers, and a method of fabricating the package of such MEMS device.

Advantageously, example embodiments include: (a) a more fully hermetically packaged MEMS device to target low cost industrial, automotive and consumer applications that are not reached by higher cost packaged devices; (b) a more fully hermetically sealed MEMS device fabrication process flow in which both a front-end process flow and a packaging process flow take advantage of semiconductor batch processing techniques applied in the fabrication of non-MEMS integrated circuit devices and take advantage of installed automated machines; and (c) a more fully hermetically sealed MEMS device that includes appropriate passivating and lubricating agents, or controlled gaseous pressure in internal cavities.

Life test and stress test data indicated that the lubricating and passivating characteristics of compounds deposited in hermetic packages of MEMS devices with moving parts may deteriorate over time. The chief culprit for the compound degradation may be exposed surfaces of copper layers needed in high-conductivity seed layers and low-resistance traces for plating uniformity.

The problem of lubricant degradation is solved by a methodology to deposit the bond metals, so that they extend over the width and also over the sidewalls of patterned seed metal piles, thereby encapsulating the copper of the seed metal layers. The methodology is based on using photoresist invers to existing practice, namely covering the region intended for plating rather than exposing the region.

Figures 1, 2:
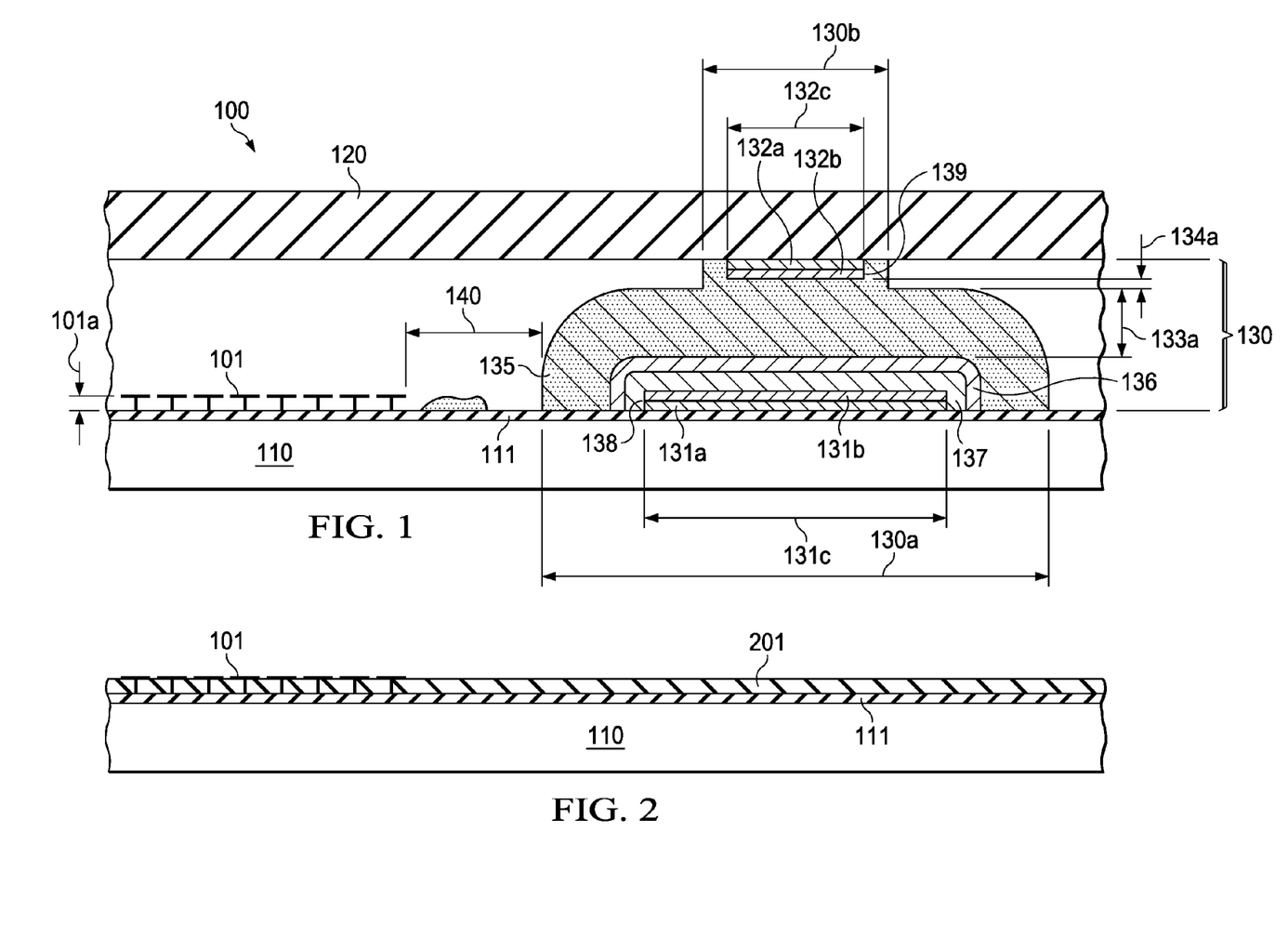
FIG. 1 shows a cross section of a portion of a MEMS device with a hermetically sealed cap forming a cavity over the MEMS, the cavity including a lubricant, the cap attached to the substrate by a vertical stack of metal layers including gold-indium intermetallic compounds.
FIG. 2 depicts the step of protecting surface MEMS structures on a substrate with sacrificial polymer, after all surface MEMS processing steps have been completed.

The example embodiment 100 of FIG. 1 illustrates a portion of a hermetic package for a microelectromechanical system (MEMS) structure 101. The package portion shown in FIG. 1 includes a substrate 110 and an example MEMS structure, shown as a surface MEMS carried by substrate 110. At least a portion of surface MEMS 101 has a first height 101a over the substrate surface. As an example, MEMS structure 101 may be an array of individually addressable micromirrors of a digital mirror device (DMD) such as a Texas Instruments DLP™ DMD special light modulator. For example, in this case, first height 101a may be in the range from 0.5 μm to 1.5 μm. In other MEMS devices, first height 101a may be smaller or greater.

For example, substrate 110 may be a chip or chip area like that of an integrated circuit chip comprising semiconductor material such as silicon, silicon germanium, or gallium arsenide. Semiconductor chips are impermeable to water molecules and thus hermetic. The substrate may include circuit components of an integrated circuit (IC) protected by an overcoat 111. In the package portion illustrated in FIG. 1, the protective overcoat 111 is depicted as covering the whole substrate surface so that overcoat 111 can be considered the effective substrate surface. Also, the package of device 100 includes a cap or cover 120, which is configured to provide an enclosed cavity for housing MEMS structure 101. In the example of DMDs, cap 120 is a flat plate or other structure providing transparency to enable external light of desired wavelengths to reach and be selectively modulated by position settable reflecting surfaces of structure 101. In other MEMS devices, cap 120 may be opaque, or may have a dome-shaped configuration. In any case, cap 120 is formed to be impermeable to water molecules and thus hermetic.

As illustrated on FIG. 1, cap 120 is attached to substrate 110 by a vertical stack 130 of metal layers. Stack 130 has a continuous contour that peripherally laterally surrounds MEMS structure 101 at a spacing distance 140 from MEMS structure 101. In example DMDs, distance 140 may be between 50 µm and 200 µm. The adhesion of stack 130 to substrate 110 may be enabled by 131a and 131b, and the adhesion of stack 130 to cap 120 may be enabled by metallic seed films 132a and 132b. In an example implementation, seed films 131a and 132a may have a thickness of 100 nm and include a refractory metal of the IV A Group of the Periodic Table of Elements, such as titanium, and seed films 131b and 132b may have a thickness of 200 nm and include a metal of high electrical conductivity such as copper or aluminum. Seed films 131a and 131b have a common sidewall 138, and seed films 132a and 132b have a common sidewall 139. In another example implementation (see FIG. 12), the seed films of refractory metal include a metal of the V A Group of the Periodic Table of Elements, such as tantalum. In this case, the sidewall of the seed film of high conductivity metal is set back from the sidewall of the seed film of refractory metal. The adhesion of stack 130 to substrate 110 and to cap 120 is made impermeable to water molecules and thus hermetic.

As illustrated in FIG. 1, seed films 131a and 131b have a first width 131c. In example DMDs, first width 131c may be between about 100 µm and 150 µm. Seed films 132a and 132b have a second width 132c smaller than first width 131c. In example DMDs, second width 132c may be between about 50 µm and 80 µm.

Vertical stack 130 of FIG. 1 includes a plurality of metal layers of various thicknesses and widths. The portion of stack 130 near substrate 110 joins seed films 131a and 131b, wraps around their common sidewall 137, fully encapsulating sidewall 137, and thus has a width 130a greater than seed film width 131c. The portion of stack 130 near cap 120 joins seed films 132a and 132b, wraps around their common sidewall 138, fully encapsulating sidewall 138, and thus has a width 130b larger than seed film width 132c, but tapered or stepped upwardly and inwardly from width 130a. As illustrated in embodiment 100 of FIG. 1, metal stack 130 includes a plurality of layers 135, 136 and 137. In other MEMS device implementations, layer 137 or layer 136, or both, may be omitted, or an additional one or more metal layers may be added.

In an example implementation, bottom layer 137 is joined to seed film 131, is made of copper, and has a thickness of about 2 µm. Intermediate layer 136 is joined to layer 137, is made of nickel which acts as a barrier layer against metal diffusion, and has a thickness of about 1 µm. Layer 136 fully encapsulates layer 137; consequently, when layer 136 is made of nickel, out-diffusion of underlying copper is inhibited. Top metal layer 135 has its bottom joined to intermediate layer 136, its top joined to seed film 132b, and a width that varies upwardly and inwardly from width 130a to width 130b. A lower portion of layer 135 of generally uniform width 130a has a thickness 133a of between about 5 µm and 10 µm, and the upper portion of layer 135 of tapered or stepped width has a thickness 134a of between about 2 µm and 4 µm. For some MEMS devices, enhanced adhesion can be achieved and any out-diffusion of copper from seed film 132b can be inhibited by the addition of a nickel layer of about 1 µm thickness between the upper portion of thickness 134a and seed film 132b.

For the example MEMS device illustrated in FIG. 1, metal layer 135 includes gold-indium intermetallic compounds of various compositions, such as AuIn2 with a melting temperature of about 540° C. and AuIn with a melting temperature of about 509° C.

Also, metal layer 135 may include metallic gold not consumed by intermetallic compounds. As described hereinbelow, with gold provided with a wider bond line than indium during fabrication and in an amount considerably more plentiful than the amount of indium, the increase of temperature allows the gold surface to react with any excess indium, capturing it as intermetallic compounds.

An example embodiment of a wafer-level process flow for the fabrication of low-temperature hermetically sealed MEMS structure devices is illustrated with reference to FIGS. 2 to 11. FIGS. 2 to 6 illustrate certain wafer-level process steps to fabricate metal layers surrounding MEMS structures, the metal layers suitable for hermetic sealing of packages and encapsulating lubricant-degrading compounds. FIGS. 7 to 10 show certain wafer-level process steps for fabricating caps with metallization to complete the sealing of hermetic MEMS packages.

FIG. 2 shows an unsingulated chip area of a substrate 110, such as a chip area of an integrated circuit of a semiconductor wafer 110 at a process stage where the initial processing of MEMS structures 101 has been completed. The chip area of wafer 110 may include circuitry for each chip, such as integrated circuits manufactured by CMOS technology. The included circuitry is electrically connected to the respective MEMS structures. Wafer 110 covered by a layer 111 of protective overcoat such as silicon nitride and silicon oxide. In the illustrated embodiment, movable portions of the MEMS structures 101 are shown above the wafer surface, i.e., above the overcoat layer 111, by a height 101a. The height 101a of the MEMS structures above the overcoat is herein referred to as first height 101a. For the example of digital mirror devices (DMD), first height 101a may be in a range of about 0.5 µm to 1.5 µm. The MEMS structures (e.g., movable mirrors of a DMD) are advantageously supported by a protective polymeric material 201 such as a layer of photoresist, which can be sacrificed and removed at a later stage of the process flow. Advantageously, the steps of forming the packaging, bonding, and sealing features begin only after the surface MEMS processing is complete, so that integration issues caused by structure topology may be prevented.

The layout of the package features is next defined and the substrate surface is covered with a patterned metallic seed film for anchoring the package sealing structures.

To pattern protective layer 201, a photoresist layer 301 (see FIG. 3A) is deposited on protective layer 201 through a mask or, alternatively, sealed MEMS structures, as illustrated in FIGS. 2 to 11 by certain process steps. FIG. 2 shows a portion of a substrate 110 such as a semiconductor wafer at a process stage where the processing of MEMS structures 101 has been completed. The semiconductor wafer 110 may include circuitry for each chip, such as integrated circuits manufactured by CMOS technology; the circuitry is electrically connected to the respective MEMS structures. Advantageously, wafer 110 is covered by a layer 111 of protective overcoat, such as silicon nitride and silicon carbide. The MEMS structures 101 are shown as surface MEMS, i.e. above overcoat layer 111; the height 101a of the MEMS structures above the overcoat is herein referred to as first height 101a. For the example of digital mirror devices (DMD), first height 101a may be between about 0.5 µm and 1.5 µm. The MEMS structures are preferably embedded in a protective polymeric material 201 such as photoresist, which can be sacrificed and removed at a later stage of the process flow. Advantageously, the steps of forming the packaging, bonding, and sealing features begin only after the surface MEMS processing is complete, so that integration issues caused by structure topology can be prevented.

The next processes steps involve defining the layout of the package features and to cover the substrate surface with patterned metallic seed films for anchoring the package seal structures. To pattern protective layer 201, a photoresist layer 301 (see FIG. 3A) is deposited on protective layer 201 through a mask or, alternatively, deposited as a layer and then photoetched. Protective layer 201 is selectively etched to create an opening of lateral width 310, with a portion of overcoat 111 exposed in the opening of width 310. Opening of width 310 follows a continuous contour laterally peripherally surrounding the MEMS structure 101 and spaced from the MEMS structure by a distance 320.

Figure 3A:
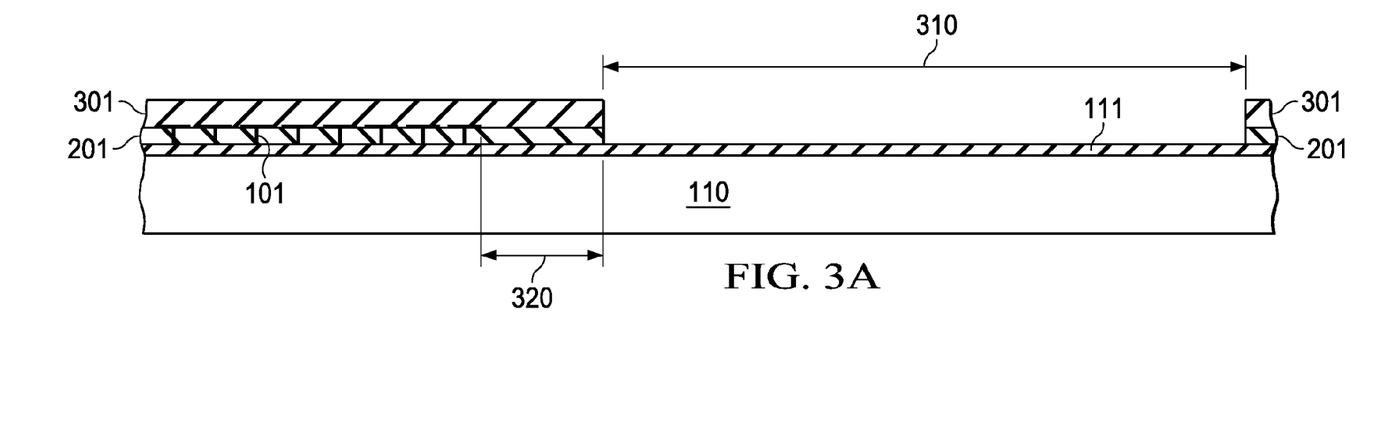
FIG. 3A shows the steps of patterning and etching of the package metal layout.
Figure 3B:
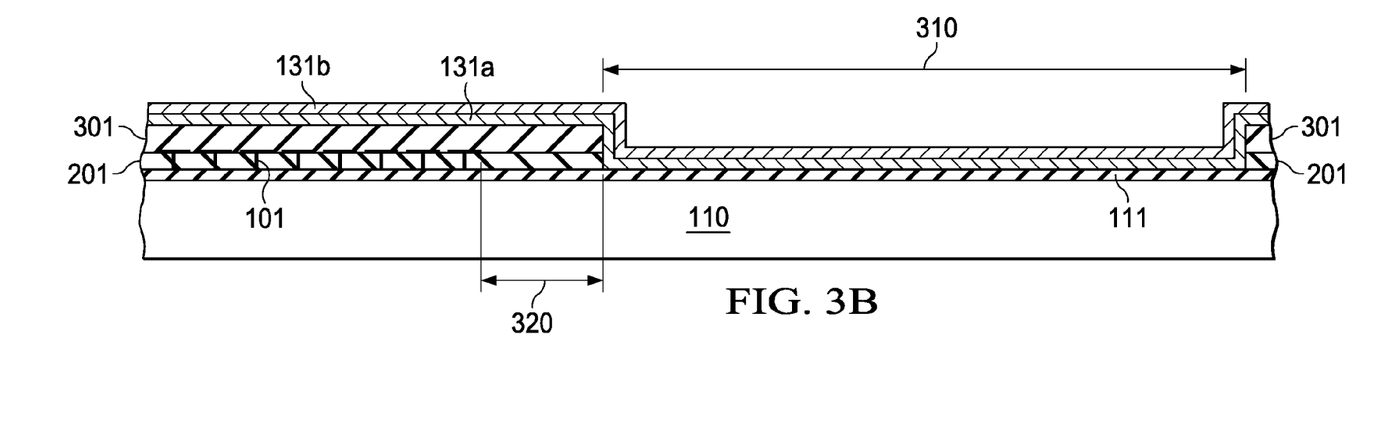
FIG. 3B illustrates the steps of depositing seed metal layers including a layer of a refractory metal and a layer of high-conductivity metal.

In the next process step, illustrated in FIG. 3B, metallic seed films 131a and 131b are blanket deposited over the patterned photoresist layer 301 and within the opening of width 310. Metallic seed film 131a is of a material that has strong adhesion to overcoat 111. In one implementation, film 131a is selected from a group including metals of the IV A Group of the Periodic Table of Elements, comprising titanium, zirconium, hafnium, and alloys thereof with chromium, molybdenum, and tungsten. Preferably, film 131a has a thickness of about 100 nm. For another implementation using a metal of the VA Group, see hereinbelow. Seed film 131b uses a metal of high electrical conductivity and preferably low cost, such as copper and aluminum, also beryllium, magnesium, silver, and gold. Preferably, film 131b has a thickness of about 200 nm. Seed films 131a and 131b form a vertical pile of layers, referred to herein as first vertical pile.

Figure 4A:
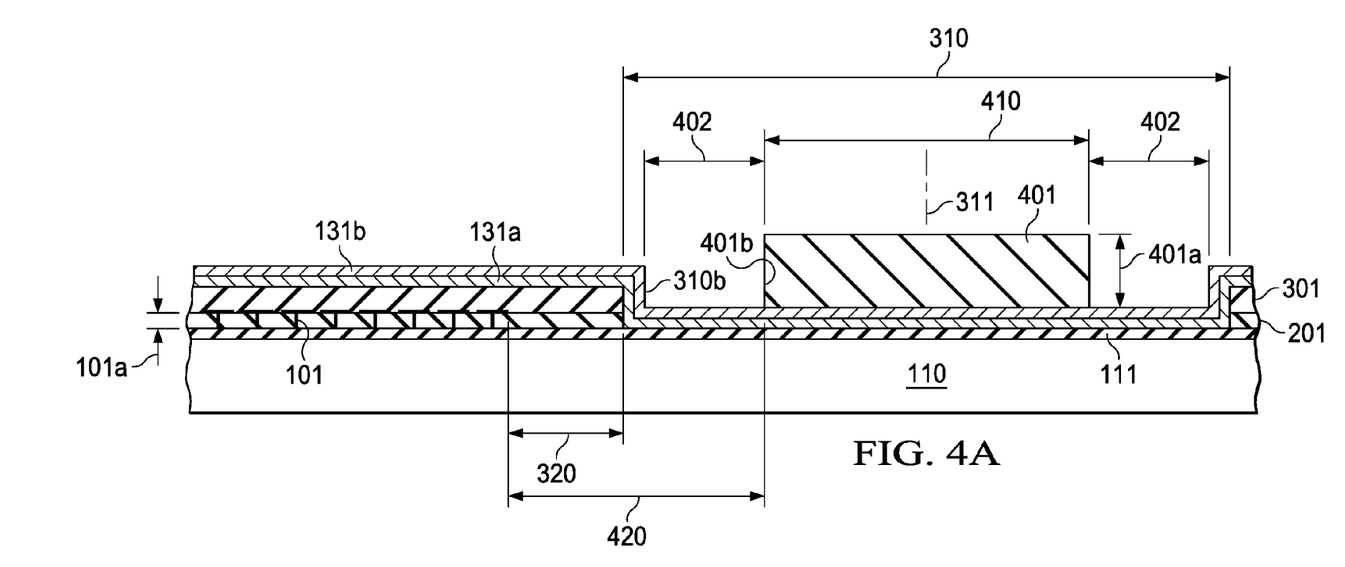
FIG. 4A depicts the step of patterning the seed metal layers by covering the region-to-be-plated with a first mask layer.

As illustrated in FIG. 4A, the second seed layer 131b of the vertical pile of seed layers is next covered with a patterned layer (referred to as the first mask layer) 401 over a region with first width 410 and a contour continuously peripherally surrounding the MEMS structures 101 and laterally spaced by a distance 420 from the MEMS structure. Distance 420 is greater than distance 320. First mask 401 is positioned substantially symmetrical from the center of opening of width 310 with about equal mask portions to either side of the center. (This center is indicated by phantom line 311 in FIG. 4A). Due to this symmetry, the distance 402 between a mask side 401b and the nearest opening side 310b is about the same along the contour of mask 401. Mask 401 has the same general two-dimensional continuous contour configuration as the opening of width 310 previously formed in protective layer 301 (see FIG. 3A) and is spaced by distance 420 from the MEMS structure 101. Distance 402 is selected so that it can accommodate the thicknesses of the metal layers plated as a stack in the following deposition steps (see FIG. 5). For example, width 410 may be between about 100 µm and 150 µm. For example, the material for first mask 401 may be a photoresist polymer. The height 401a of mask 401 is sufficient to withstand the following etching process step. The remaining seed layers not covered by first mask 401 are exposed.

Figure 4B:
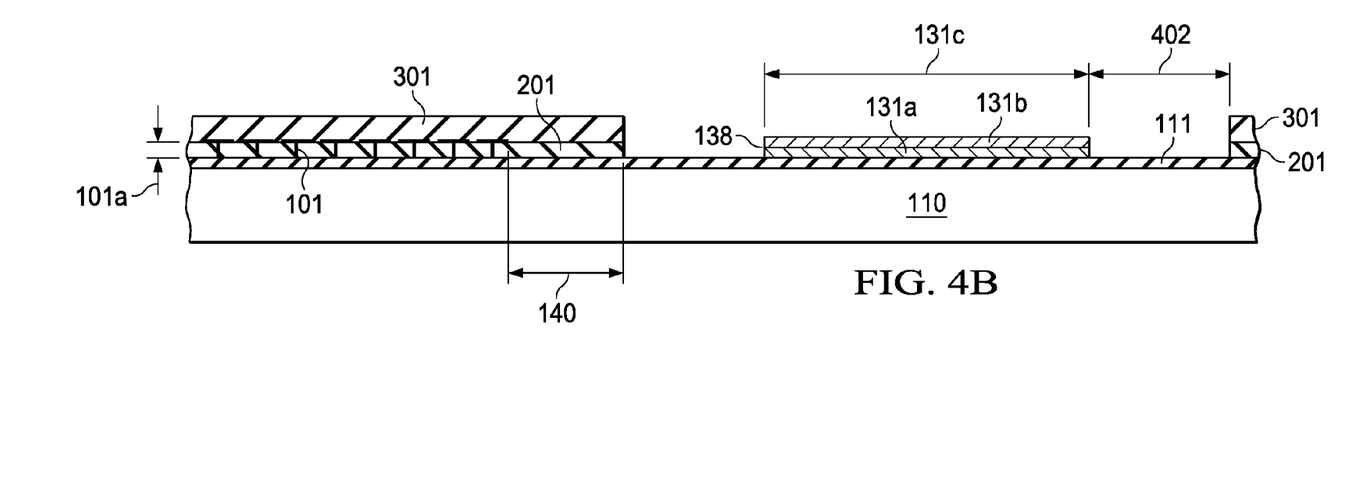
FIG. 4B shows the step of etching the seed metal layers uncovered by the first mask layer, creating sidewalls of the layers; thereafter, the first mask layer is removed.

FIG. 4B depicts the result of etching the first pile of seed layers in regions uncovered by the first mask layer 401 of width 410. The etching step involves a chemical or plasma etching technique and leaves the first pile unetched with a width 131c, which is substantially the same as first width 410 of the mask, and creates common sidewalls 138, which are substantially the same for layers 131a and 131b. After the etching process, first mask layer 401 is removed.

Figure 5:
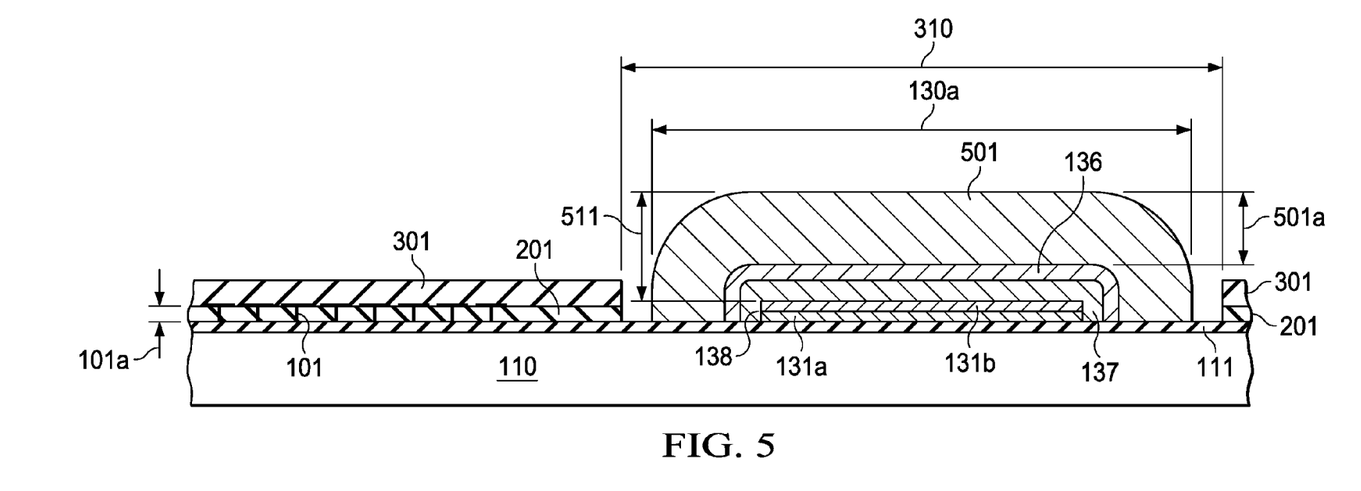
FIG. 5 illustrates the step of plating a first vertical stack of one or more metal layers including a top layer of a first metal, covering the seed metal sidewalls.

FIG. 5 illustrates the formation of a vertical stack of metal layers over the seed film 131b and sidewall 138. The layers are deposited sequentially; the preferred deposition process is electrolytic plating because it is able to produce uniform layers in short periods of time. In one example, a bottom layer 137 (such as copper) of about 2 µm thickness is formed that adheres to metallic seed film 131b, sidewalls 138, and overcoat 111 exposed on the bottom of the opening of width 310. Next, a barrier layer 136 (such as nickel) of about 1 µm thickness is formed over the layer 137; it also adheres to overcoat 111. Barrier layer 137 prevents the out-diffusion of copper atoms. And then, a top layer 501 of a first metal (such as gold) of a thickness between about 5 µm and 10 µm is formed over the barrier layer 136. The first metal also adheres to overcoat 111 and has a height 501a equal to or greater than the first height 101a. The sum of the thicknesses of layers 137, 136, and 501 provides a stack height 511 and stack width 130a. In other MEMS device implementations, one or both of layers 136, 137 may be omitted.

Figure 6:
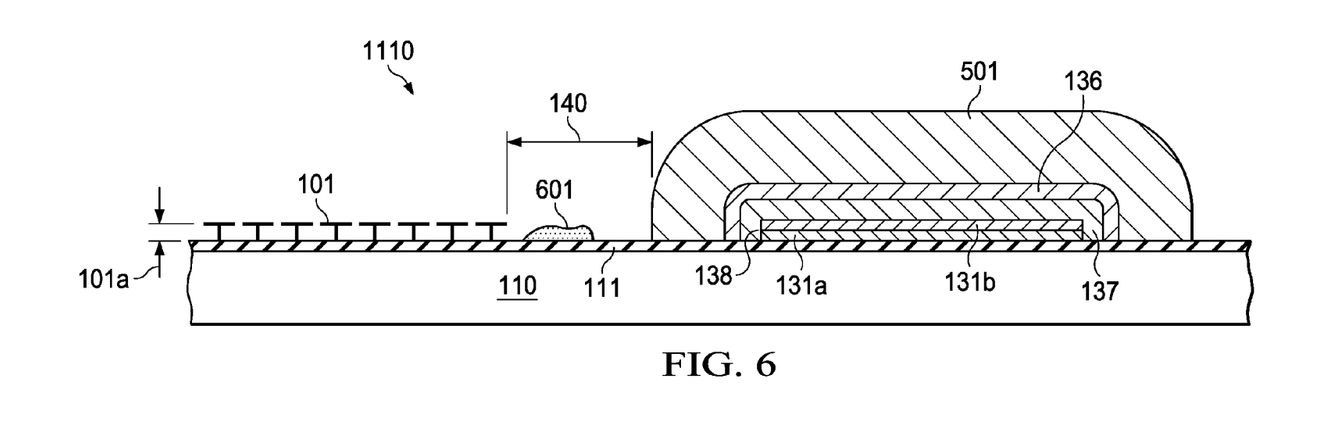
FIG. 6 depicts the step of removing the patterned polymeric material and the MEMS structure protection, and dispensing the getter and passivation material.

In the next process steps, indicated in FIG. 6, photoresist layer 301 and sacrificial protective polymer layer 201 are removed by a photoresist removal process such as plasma etching, releasing the MEMS structures 101 and freeing them for movement. As FIG. 6 shows, the result of these processes is a structure 1110 that comprises the substrate 110 with MEMS structures 101 of height 101a over the substrate upper surface and with a vertical stack of metal layers 137, 136 and 501 of width 130a and height 511 laterally continuously surrounding and spaced by a distance 140 from the MEMS structures 101. Metal layers 137, 136, and 501 cover sidewalls 138 of seed layers 131a and 131b and are attached to overcoat 111. Furthermore, when required, a getter, lubrication and passivation material 601 is dispensed.

FIGS. 7 to 10 depict steps in the wafer-level fabrication of water-impermeable caps suitable for joinder to the wafer-level structure 1110 for hermetically sealing the MEMS structures formed in the chip areas of the substrate.

Figure 7:
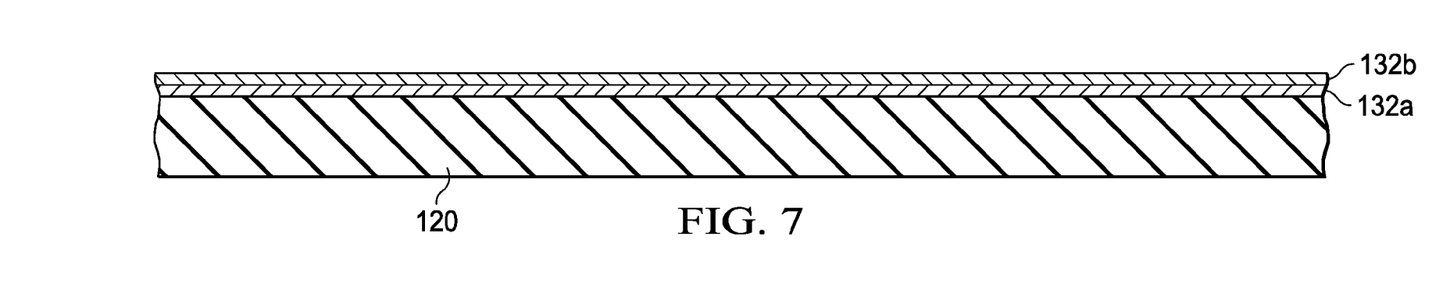
FIG. 7 indicates the step of depositing seed metal layers including a layer of a refractory metal and a layer of a high conductivity metal on a wafer-size cap material.

FIG. 7 indicates the step of providing a flat cap 120 with a surface with metallic seed films 132a and 132b suitable for DMD devices. The illustrated cap 120 may be made of a glass transparent to visible light. Metallic seed film 132a is of a material that has strong adhesion to the material of cap 120. In one implementation, film 132a is selected from a group including metals of the IV A Group of the Periodic Table of Elements, comprising titanium, zirconium, hafnium, and alloys thereof with chromium, molybdenum, and tungsten. Preferably, film 132a has a thickness of about 100 nm. Seed film 132b uses a metal of high electrical conductivity and preferably low cost, such as copper and aluminum, also beryllium, magnesium, silver, and gold. Preferably, film 132b has a thickness of about 200 nm. Second seed films 132a and 132b represent a second vertical pile of seed layers. Cap 120 is formed on a wafer scale and thus compatible with a wafer-scale assembly for the MEMS structures. Although a flat cap 120 is used for illustrative purposes, the configuration of the cap structure may be a vaulted dome or other configuration different than a flat cap, with the specific configuration determined based on the type and configuration of MEMS structure involved and also in consideration of other particular needs and individual preferences.

Figure 8:
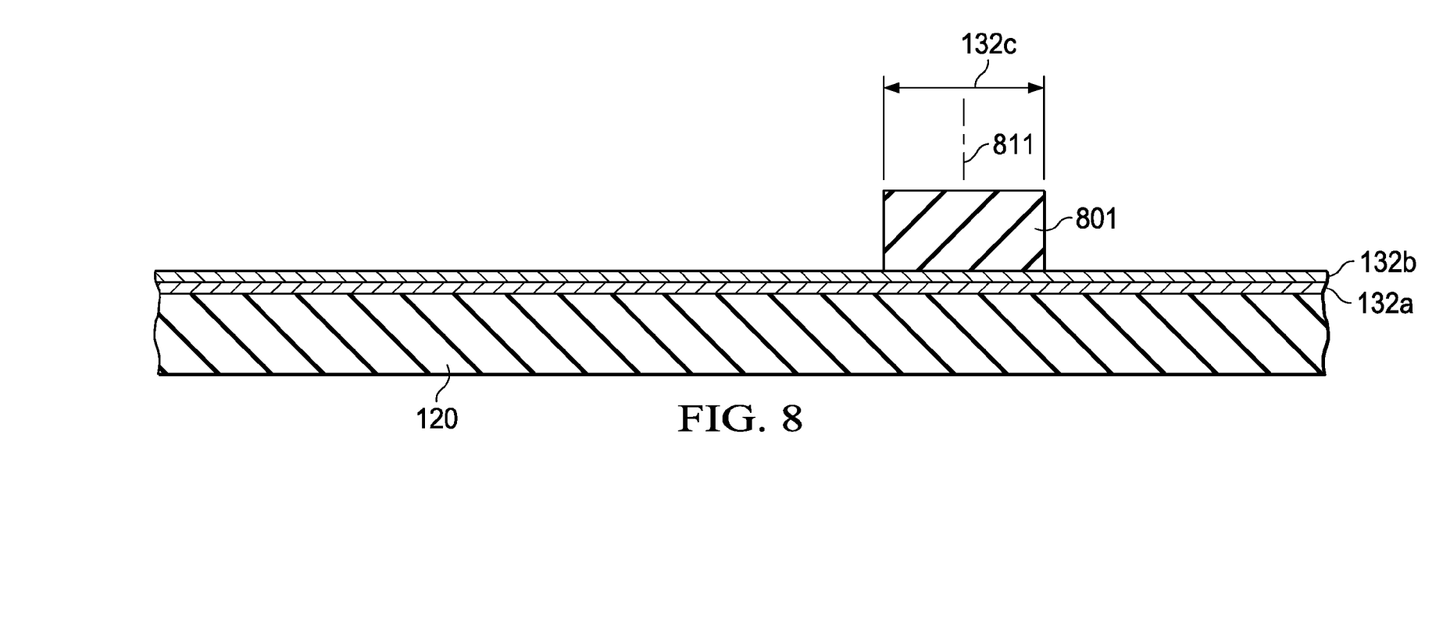
FIG. 8 depicts the step of patterning the seed metal layers by covering the region-to-be-plated with a second mask layer.

As illustrated in FIG. 8, the second seed layer 132b of the second vertical pile of seed layers is next covered with a layer of a polymeric material such as a photoresist layer 801 (referred to as the second mask layer). Photoresist layer 801 is patterned to provide a width 132c less than width 410; phantom line 811 indicates the center of second mask layer 801. Width 132c has the same general two-dimensional continuous contour configuration as the first mask layer 401 described hereinabove, but of lesser or greater lateral width than the contour of the etched first pile (of seed layers 131a and 131b). Width 132c is positioned so that width 132c may be brought into alignment generally centrally of the width 410 of the stack of layers 131a and 131b in later processing. By this alignment, center line 811 is brought into alignment with center line 311 of FIG. 4A. As FIG. 8 shows, the seed layers 132a and 132b outside second mask layer 801 remain exposed and will be removed by etching in the next process step.

Figure 9:
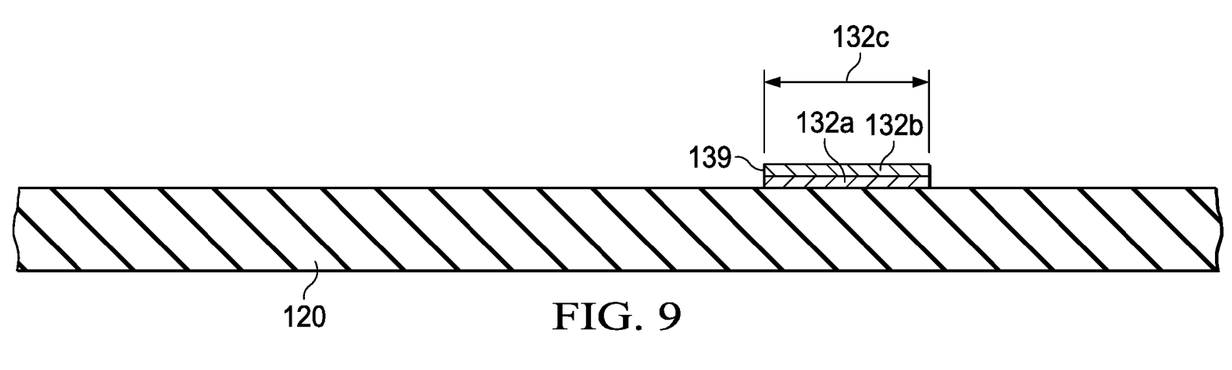
FIG. 9 shows the step of etching the seed metal layers uncovered by the second mask layer, creating sidewalls of the layers; thereafter, the second mask is removed.

FIG. 9 depicts the result of etching the second pile of seed layers in regions un-covered by the second mask layer 801 of width 132c. The etching step involves a chemical or plasma etching technique and leaves the second pile unetched with a width 132 and creates common sidewalls 139, which are substantially the same for layers 132a and 132b. After the etching process, second mask layer 801 is removed.

Figure 10:
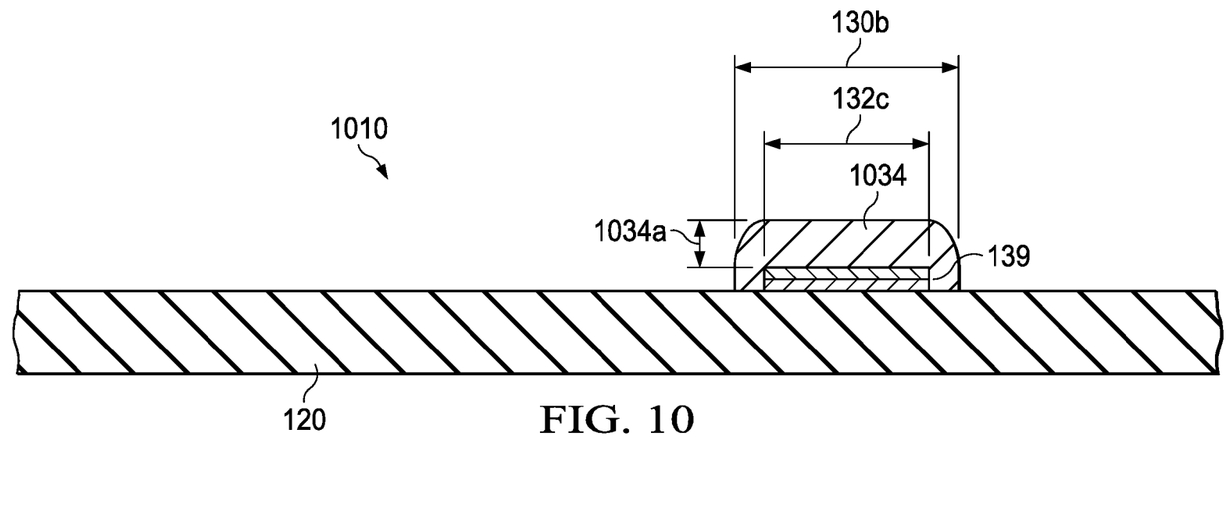
FIG. 10 illustrates the step of plating a second vertical stack of one or more metal layers including a top layer of a second metal, covering the seed metal sidewalls.

The process step shown in FIG. 10 comprises the deposition of a second vertical stack 1034 of one or more metal layers over the width 132c and the sidewalls 139 of the second pile of seed layers. The second stack 1034 includes a top layer of a second metal (such as indium) suitable to form intermetallics with the metal layer 501. In example DMD devices, layer 1034 may be formed to a height 1034a of between about 2 and 4 μm. Advantageously, a barrier layer (such as nickel) to a thickness of about 1 μm may be deposited on the width and sidewall of metallic seed films 132a before the indium metal 1034 is deposited. The barrier metal and the second metal adhere to the material of cap 120. The resulting width of metal stack 1034 is 130b. The preferred deposition technique is electrolytic plating.

In some implementations, metal layer 1034 may be a composite metal layer comprising a plurality of successively formed metal layers, such as a bottom layer of about 200 nm thickness of titanium deposited over the metallic seed layer 132b, followed by an intermediate layer of indium deposited over the titanium, and then a top layer of gold of about 100 nm thickness deposited over the indium intermediate layer.

The resulting wafer scale cap structure, illustrated in FIG. 10 and designated 1010, comprises the second metal layer 1034 (viz., indium) of width 130b and height 1034a, adhering to the metallic seed film 132b and to the surface of flat cap material 120. As mentioned, indium layer 1034 and remaining seed films 132a and 132b are configured to match and fall within the outline of gold layer 501 formed on substrate 110 as structure 1110. At this stage, the cap structure 1010 is ready to be used for the wafer-scale assembly of hermetic packages for the MEMS structures on substrate 110 of structure 1110.

As mentioned, for some MEMS devices, such as DMDs, chemical gettering substances, lubricants, corrosion inhibitants and/or other materials (generally designated 601 in FIG. 6) may be added before or contemporaneously with sealingly joining the cap and substrate structures 1010 and 1110.

Figure 11:
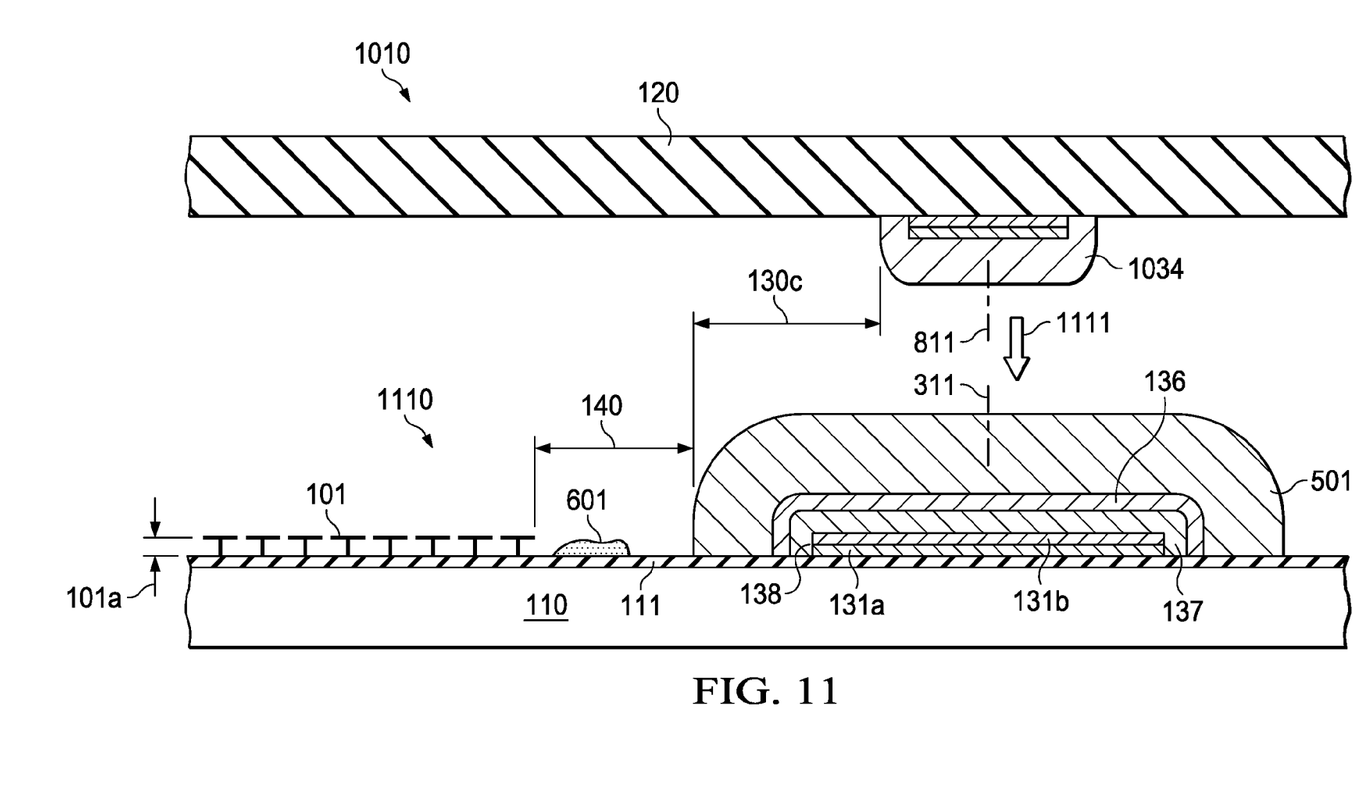
FIG. 11 illustrates the package assembly steps by aligning the cap stack of metals with the substrate stack of metals to contact indium and gold layers.

FIG. 11 illustrates the package assembly step. Cap 1010 is aligned with substrate 1110 so that indium layer 1034 is facing gold layer 501. In FIG. 11, indium layer 1034 is approximately centered above gold layer 501 as indicated by indium center line 811 substantially matched with gold centerline 311. This alignment step leaves a lateral distance 130c from the inside perimeter edge of the laterally continuous contour of indium layer 1034 to the corresponding inside perimeter edge of the similar laterally continuous contour of gold layer 501. Cap 1010 is then lowered (indicated by arrow 1111) onto substrate 1110 in order to bring indium layer 1034 into contact with gold layer 501, resulting in an asymmetrical bond line width, wherein the indium width at the bond line is narrower (and, in some embodiments, significantly narrower) than the gold width at the bond line.

Without delay and with the indium layer and gold layer in contact, thermal energy is applied in order to raise the temperature until the indium metal is liquefied at about 156° C. Preferably, the temperature is kept between about 156 and 200° C., because this temperature range is low compared to typical processing temperatures of silicon components and MEMS structures. Because the amount of indium is small relative to the amount of gold, after a short period of time the indium metal is dissolved into the gold layer by forming gold-indium intermetallic compounds (the interaction is often referred to as a transient liquid phase process). Among the formed compounds are the indium-rich compound AuIn2 and the compound AuIn. The oversized gold surface (relative to the indium surface in contact with the gold surface) acts to capture excess liquid indium to form intermetallic compounds 601 before liquid indium can enter sidewise into the MEMS structure headspace. An occasional residual indium metal squeezed sidewise is neutralized by the distance 140 of the gold perimeter to the MEMS structures 101. As indicated in FIG. 1, the resulting layer of intermetallics and residual gold is designated 135. The insertion of barrier layer 136 of nickel effectively blocks an interaction of gold with copper of layer 137 within the stated low temperature range. However, even in the absence of the nickel layer, gold will interact much more slowly with copper than with indium. Because nickel layer 136 wraps round the sidewalls of copper layer 137 and is in touch with protective layer 111, out-diffusion of copper is inhibited.

After the transient liquid phase wafer-level assembly process described with reference to FIG. 11, the resulting MEMS packages shown in FIG. 1 are formed. The packages all have metal stacks 130 which adhere to the substrate (silicon wafer) 110 and to cap (glass plate) 120 and are thus substantially fully hermetic. The wafer can subsequently be singulated into discrete MEMS devices, such as by sawing the wafer to separate the chip areas into discrete chip packages.

In contrast to the low temperature range of 156 to 200° C. for forming gold-indium intermetallics, any re-melting of the intermetallic compounds would require much higher temperatures, such as about 509° C. for AuIn and about 540° C. for AuIn2. Consequently, additional device processing after package assembly is possible with less concern about thermal degradation of the hermetic seal. An example is the solder processes used for attachment to external parts such as other components and circuit boards.

Figure 12:
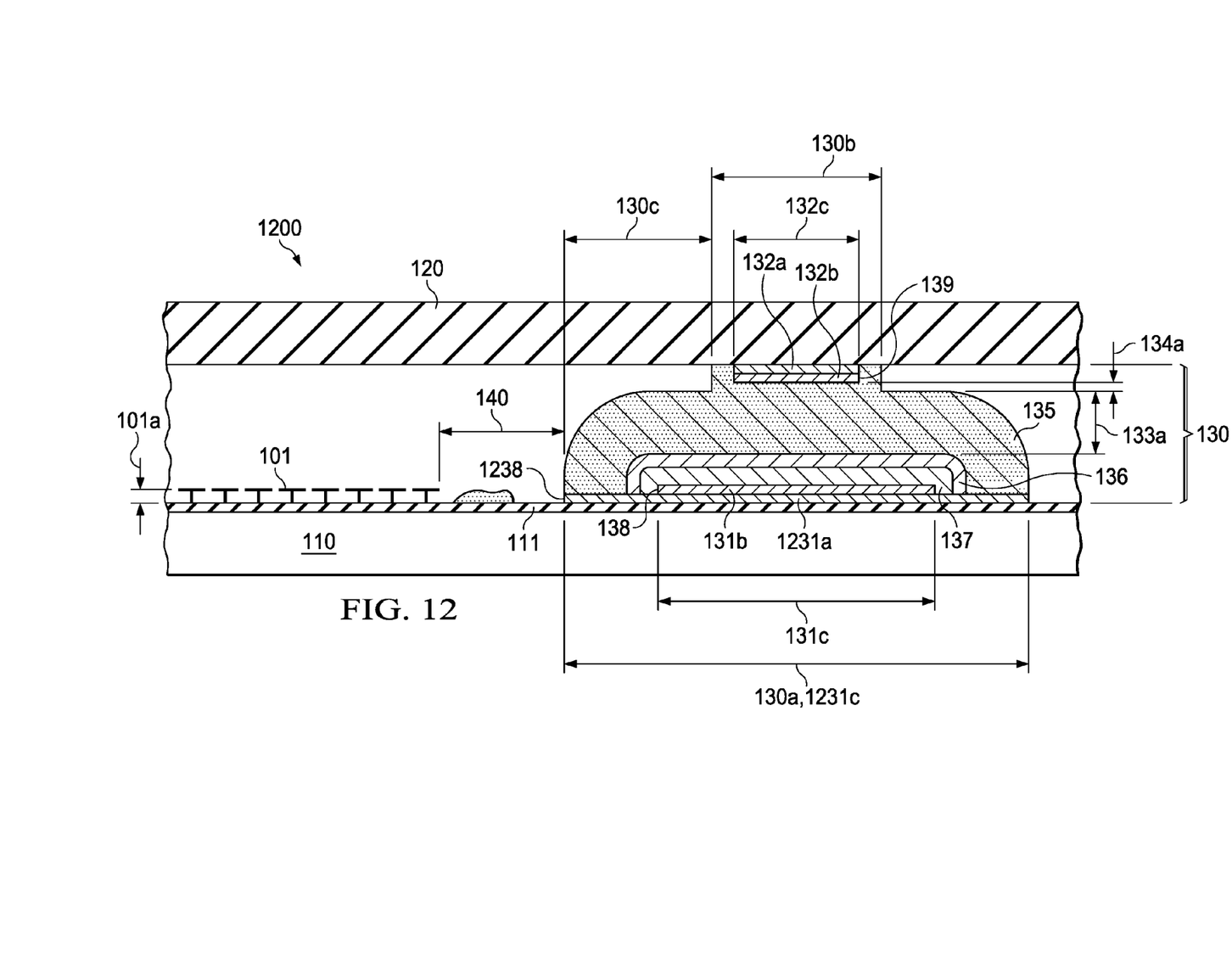
FIG. 12 depicts a cross section of a portion of another MEMS device with a hermetically sealed cap forming a cavity over the MEMS, the cavity including a lubricant, the cap attached to the substrate by a vertical stack of metal layers including gold-indium intermetallic compounds.

FIG. 12 shows another example embodiment 1200 of a hermetic package for a MEMS structure which is combined with certain isolated structures, as needed such as in Variable Electrostatic Actuators (VEAs). This example embodiment is based on a wafer-level process flow for the fabrication of low-temperature hermetically sealed MEMS structure devices, which requires an especially high degree of plating uniformity, while the polymeric sacrificial material embedding the MEMS structures is selected to protect against the plating chemistry. The high plating uniformity is achieved by a two-step etching process of the two seed layer stack, in contrast to the single-step etching process of FIG. 4B employed in the above-described fabrication flow. For this application, the refractory metal of the seed layer stack is advantageously selected from the VA Group of the Periodic Table of Elements.

As FIG. 12 indicates, the structure of the package of device 1200 is analogous to the package of device 100 illustrated in FIG. 1. The difference of device 1200 compared to device 100 is the configuration and the metal of the seed layer 1231a made of refractory metal adhering to overcoat 111. In an example implementation, seed film 1231a may have a thickness of 100 nm and include a refractory metal of the V A Group of the Periodic Table of Elements, such as tantalum, niobium, or vanadium. Seed film 131b may have a thickness of 200 nm and include a metal of high electrical conductivity such as copper or aluminum. As illustrated in FIG. 12, seed film 1231a has a width 1231c, which is substantially identical to the width 130a of the stack of plated metal layers, while seed film 131b has the width 131c, which is smaller than width 1231c. In example DMDs, width 131c may be between about 100 μm and 150 μm, and width 1231c may be between about 120 μm and 170 μm. As a consequence of the different widths, seed film 1231a has a sidewall 1238 different from the sidewall 138 of the seed film 131b.

Seed metal layers 1231a and 131b are deposited in a process step analogous to the deposition step described in conjunction with FIG. 3B. Seed metal layer 131b (such as copper) is etched in a process step as described in conjunction with FIG. 4B. In contrast, seed metal layer 1231a (such as tantalum) is etched in a separate etching step in the time window after completing the plating processes of the metal layers described in FIG. 5, but before the removal of the sacrificial polymer layer protecting the MEMS structures depicted in FIG. 6.

The principles described herein apply to any semiconductor material for the chips, including silicon, silicon germanium, gallium arsenide, gallium nitride, or any other semiconductor or compound material used in manufacturing. The same principles may be applied both to MEMS components formed over the substrate surface and to MEMS components formed within the substrate. The caps used in packaging the components may be flat, curved, or any other geometry that suits individual needs and preferences. The caps may be transparent or completely opaque to all or specific wavelengths or ranges of wavelengths of visible light, infrared light, radio frequency or radiation in other portions of the electromagnetic spectrum.

The contacting metal layers of the stacks formed on the substrate and cap may be other than gold and indium, with other suitable choices being described in U.S. patent application Ser. No. 13/671,734 filed Nov. 8, 2012, the entirety of which is hereby incorporated herein by reference. Also, the relative widths of the metal stacks can be reversed, with the wider stacks being formed on the cap and the narrower stack being formed on the substrate. In such case, the top layer of the wider stack formed on the cap instead of the substrate will be formed of the higher melting temperature meta; (e.g., gold) and the top layer of the narrower stack formed on the substrate instead of the cap will be formed of the lower melting temperature metal. In such case, too, it may be advantageous to join the substrate from above to the cap, rather than join the cap from above to the substrate, to assist collection of liquefied lower melting temperature metal on the wider higher melting temperature metal.

For fully hermetic MEMS packages, the described approach realized that general eutectic bonding may offer low temperature sealing of packages and thus be compatible with low temperature MEMS structures, but the resulting seals would de-bond at the same low temperatures as the sealing process and thus not allow post-sealing temperatures above the sealing temperature as required by some customer board assembly and device operations.

The problem is addressed of sealing low cost hermetic packages at low temperatures, and thus permitting lubrication of surface MEMS structures, but allowing device operation at temperatures significantly above the sealing temperature. In the example gold/indium system approach a methodology is based on a transient liquid phase sealing technique at low temperatures, which creates intermetallic compounds re-melting only at much higher temperatures. Yet, in a configuration wherein the gold amount is in excess, the indium amount is restricted and kept within confined borders. In the described process flow, indium and gold are kept separate until immediately before sealing, creating a thermally stable solution. Making the indium bond line asymmetrical relative to the gold bond line, and especially selecting in indium bond line significantly narrower than the gold bond line, allows the gold surface to react with any excess indium before it can enter the MEMS device area, capturing the indium as intermetallic compounds.

In an example new package design, the package structures are electrically isolated from the MEMS structures; any copper used in seed layer and metallization stacks is inhibited by overlaying metal barriers from diffusing into the MEMS operating space. The temperature range, in which the indium is consumed by the gold, does not have to be much higher than the indium melting temperature (156.63° C.); it is preferably in the range from about 156 to 200° C. In contrast, the re-melting temperatures of indium-gold intermetallic compounds are much higher: for AuIn 509.6° C., for AuIn2 540.7° C. Advantageously, for hermetic low temperature MEMS structures (especially with the need for temperature-sensitive lubricants), the assembly temperature can be kept under 200° C., while applications and operations at much higher post-assembly temperatures can reliably be tolerated. Another advantage is that the cost of hermetic MEMS packages fabricated by this method compares well with the cost of conventional non-hermetic MEMS packages.

The described example packaging method separates indium and gold from each other until right at the assembly step, thus creating a thermally stable solution in contrast to known methods, where indium bodies are placed in contact with gold bodies during the fabrication process. Because indium and gold diffuse rapidly at elevated temperatures, and significantly even at ambient temperature, intermetallic compound are continuously produced at these interfaces. When the assembly temperature is reached, the intermetallic compounds do not re-melt and can thus not participate in the bonding process. Consequently, these interfaces may not be thermally stable at ambient temperature, are preferably not exposed before assembly to processing steps requiring elevated temperatures, and have limited shelf life before assembly.

The described example packaging method uses asymmetrical bond line widths. For example, the indium bond line is significantly narrower than the gold bond line. Consequently, the gold surface can react with any excess indium and can capture it as intermetallic compounds. With contacting surfaces of the indium body and the gold body at the same width, a greater chance may exist to enter the MEMS device area, because melted indium has a strong tendency to push out of a bonding surface during an assembly step.

Modifications are possible in the described embodiments, and other embodiments are possible, within the scope of the claims.

What is claimed is:

1. A method of fabricating a MEMS device, the method comprising:
   providing a substrate on which a MEMS structure is protected by a sacrificial polymer, at least a portion of the MEMS structure being a first height above a surface of the substrate;
   forming a first mask layer covering a region of the substrate, the region including the MEMS structure;
   patterning the first mask layer with an opening to expose an underlying portion of the sacrificial polymer, the opening: having a first continuous contour peripherally surrounding the MEMS structure; and being laterally spaced from the MEMS structure by at least a first distance;
   etching the exposed underlying portion of the sacrificial polymer within the opening;
   depositing a first seed layer including a Group VA-metal over the surface of the substrate;
   depositing a second seed layer including a metal of high conductivity over the first seed layer to form a first pile of seed layers;
   within the opening, forming a second mask layer covering a region of the first pile, the region: having a second continuous contour peripherally surrounding the MEMS structure; having a lesser lateral width than the opening; and being laterally spaced from the MEMS structure by at least a second distance greater than the first distance;
   etching the first pile in regions uncovered by the second mask layer, leaving a portion of the first pile unetched, while creating sidewalls along the unetched portion of the first pile, and then removing the second mask layer;
   plating a first vertical stack of one or more metal layers over the sidewalls and lateral width of the first pile, the first vertical stack including a top layer of a first metal;
   removing the first mask layer;
   removing the sacrificial polymer;
   dispensing a getter and passivation material;
   providing a cap having: a second pile of seed layers having sidewalls; and a second vertical stack of one or more metal layers over the sidewalls and lateral width of the second pile, the second vertical stack including a top layer of a second metal, wherein the second vertical stack has lesser or greater lateral width than the first vertical stack and has a third continuous contour for alignment with the first vertical stack;
   aligning the first and second vertical stacks to bring the top layer of the second metal into contact with the top layer of the first metal, wherein the first and second vertical stacks have a combined second height greater than the first height, and wherein the MEMS structure has a greater lateral width than at least one of the top layer of the first metal and the top layer of the second metal; and
   applying thermal energy to liquefy and dissolve a first one of the first and second metals into a second one of the first and second metals by forming one or more intermetallic compounds of the first and second metals.

2. The method of claim 1 wherein the Group VA-metal is selected from a group including vanadium, niobium, tantalum, and alloys and compounds thereof.

3. The method of claim 1 wherein the metal of high conductivity is selected from a group including copper, aluminum, beryllium, magnesium, silver and gold.

4. The method of claim 1 wherein the one or more intermetallic compounds have melting temperatures: greater than a melting temperature of the first one of the first and second metals; and less than a melting temperature of the second one of the first and second metals.

5. The method of claim 1 wherein melting temperatures of the second one of the first and second metals and of the one or more intermetallic compounds are greater than 260° C.

6. The method of claim 5 wherein the melting temperature of the first one of the first and second metals is less than 260° C.

7. The method of claim 1 wherein the first one of the first and second metals is indium, and the second one of the first and second metals is gold.

8. The method of claim 1 wherein depositing the first and second seed layers comprises electrolytic plating.

9. The method of claim 1 wherein providing the cap includes:
   providing a cap material element;
   depositing a third seed layer including a Group VA-metal over a surface of the cap material element;
   depositing a fourth seed layer including a metal of high conductivity over the third seed layer to form the second pile;
   forming a third mask layer covering a region of the second pile, the region having the third continuous contour;
   etching the second pile in regions uncovered by the third mask layer, leaving a portion of the second pile unetched, while creating sidewalls along the unetched portion of the second pile, and then removing the third mask layer; and
   plating the second vertical stack of one or more metal layers over the sidewalls and lateral width of the second pile.

* * * * *